United States Patent
Xu et al.

(10) Patent No.: US 7,778,154 B2
(45) Date of Patent: Aug. 17, 2010

(54) TECHNIQUES FOR REDUCING INTERFERENCE IN A COMMUNICATION SYSTEM

(75) Inventors: Bing Xu, Gilbert, AZ (US); Pravin Premakanthan, Chandler, AZ (US); Daniel B. Schwartz, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 168 days.

(21) Appl. No.: 12/054,517

(22) Filed: Mar. 25, 2008

(65) Prior Publication Data

US 2009/0245288 A1    Oct. 1, 2009

(51) Int. Cl.
*H04J 7/00*    (2006.01)
(52) U.S. Cl. ...................................... 370/212; 375/345
(58) Field of Classification Search .................. 370/212, 370/328, 329, 330, 437, 465; 375/254, 345, 375/346, 348, 349; 455/103, 115.1, 115.2, 455/115.3, 115.4, 116
See application file for complete search history.

(56) References Cited

U.S. PATENT DOCUMENTS

| | | | |
|---|---|---|---|
| 4,123,755 A * | 10/1978 | Fishbein et al. ............. 342/203 |
| 5,379,445 A * | 1/1995 | Arnstein et al. ............. 455/13.4 |
| 5,646,625 A * | 7/1997 | Burrier ....................... 342/175 |
| 5,742,900 A * | 4/1998 | Arnstein et al. ............. 455/296 |
| 6,639,983 B1 * | 10/2003 | Kielty et al. ............ 379/399.01 |
| 6,731,705 B2 * | 5/2004 | Kasapi et al. ............... 375/346 |
| 6,784,831 B1 * | 8/2004 | Wang et al. ............ 342/357.12 |
| 7,519,323 B2 * | 4/2009 | Mohebbi .................... 455/11.1 |
| 2002/0051433 A1 * | 5/2002 | Affes et al. ................. 370/335 |
| 2002/0111149 A1 * | 8/2002 | Shoki ....................... 455/277.1 |
| 2006/0131414 A1 * | 6/2006 | Nakaya et al. ............... 235/451 |
| 2007/0010202 A1 * | 1/2007 | Yamamoto et al. ......... 455/63.1 |
| 2007/0230639 A1 * | 10/2007 | Stirling-Gallacher ....... 375/347 |
| 2009/0088098 A1 * | 4/2009 | Xu et al. .................. 455/127.2 |

* cited by examiner

*Primary Examiner*—Chi H. Pham
*Assistant Examiner*—Kevin Mew
(74) *Attorney, Agent, or Firm*—Dillon & Yudell LLP

(57) ABSTRACT

A technique of operating a communication device includes identifying a signal null associated with a signal to be transmitted on a first communication channel. A channel gain of the first communication channel is adjusted at a time that substantially coincides with the signal null to reduce transient noise spectrum coupled from the first communication channel to one or more second communication channels.

20 Claims, 6 Drawing Sheets

US 7,778,154 B2

TECHNIQUES FOR REDUCING INTERFERENCE IN A COMMUNICATION SYSTEM

BACKGROUND

1. Field

This disclosure relates generally to a communication system and, more specifically, to techniques for reducing interference in a communication system.

2. Related Art

A wide variety of electronic devices have employed variable gain amplifiers (VGAs). A segmented variable gain amplifier (SVGA) is a type of VGA that has been employed in conjunction with power amplifiers (PAs) in transmitters of various devices, such as subscriber stations (SSs) in communication systems. The implementation of SVGAs in complementary metal-oxide semiconductor (CMOS) devices is a relatively new approach for mobile telephone transceiver designs. In general, employing an SVGA in a transmitter of a communication system may facilitate an increase in dynamic range and transmit power change accuracy. Unfortunately, stepping SVGA gain operation may cause radio frequency (RF) glitches at an output of an associated transmitter. The RF glitches may degrade system performance by introducing noise in adjacent/alternate channels. Transient adjacent/alternate channel leakage ratio (ACLR) is a measure of gain switching effects on spectrum purity in adjacent channels (at 5 MHz in wideband code division multiple access (WCDMA) systems) and alternate channels (at 10 MHz in WCDMA systems). In WCDMA systems, transient ACLR is defined as the ratio between average power and peak instantaneous power at an offset of 5 MHz and 10 MHz from an assigned carrier. WCDMA signals of user equipment (UE) typically have a peak-to-average power ratio (PAR) of 3 to 7 decibel (dB) at a transmit antenna. Depending on an operating antenna power level, an SVGA gain adjustment (which may be rapidly implemented) can lead to failure of transient ACLR specifications in an adjacent channel (5 MHz) and/or in an alternate channel (10 MHz).

Various conventional design approaches have addressed RF glitch problems associated with power amplifier (PA) gain switch. In one conventional design approach, digital gain step at baseband is employed to offset transitions in RF power. In this case, RF glitches are minimized by optimizing timing between RF gain adjustment and baseband gain adjustment. In general, when RF glitch duration (caused by PA gain adjustment) ranges from about 4 to 20 microseconds, prior art approaches adequately meet transient ACLR specifications. However, the prior art approaches are not generally adequate in devices that employ fast gain stepping (e.g., in situations where gain adjustment (switching) times are in the nanoseconds). For example, timing alignment becomes difficult and at times impossible depending on how much baseband poles vary with process and temperature. Moreover, conventional approaches have not taken into account that transient ACLR performance is data and modulation dependent and varies with measurement period.

BRIEF DESCRIPTION OF THE DRAWINGS

The present invention is illustrated by way of example and is not intended to be limited by the accompanying figures, in which like references indicate similar elements. Elements in the figures are illustrated for simplicity and clarity and have not necessarily been drawn to scale.

DETAILED DESCRIPTION

Figure 1:
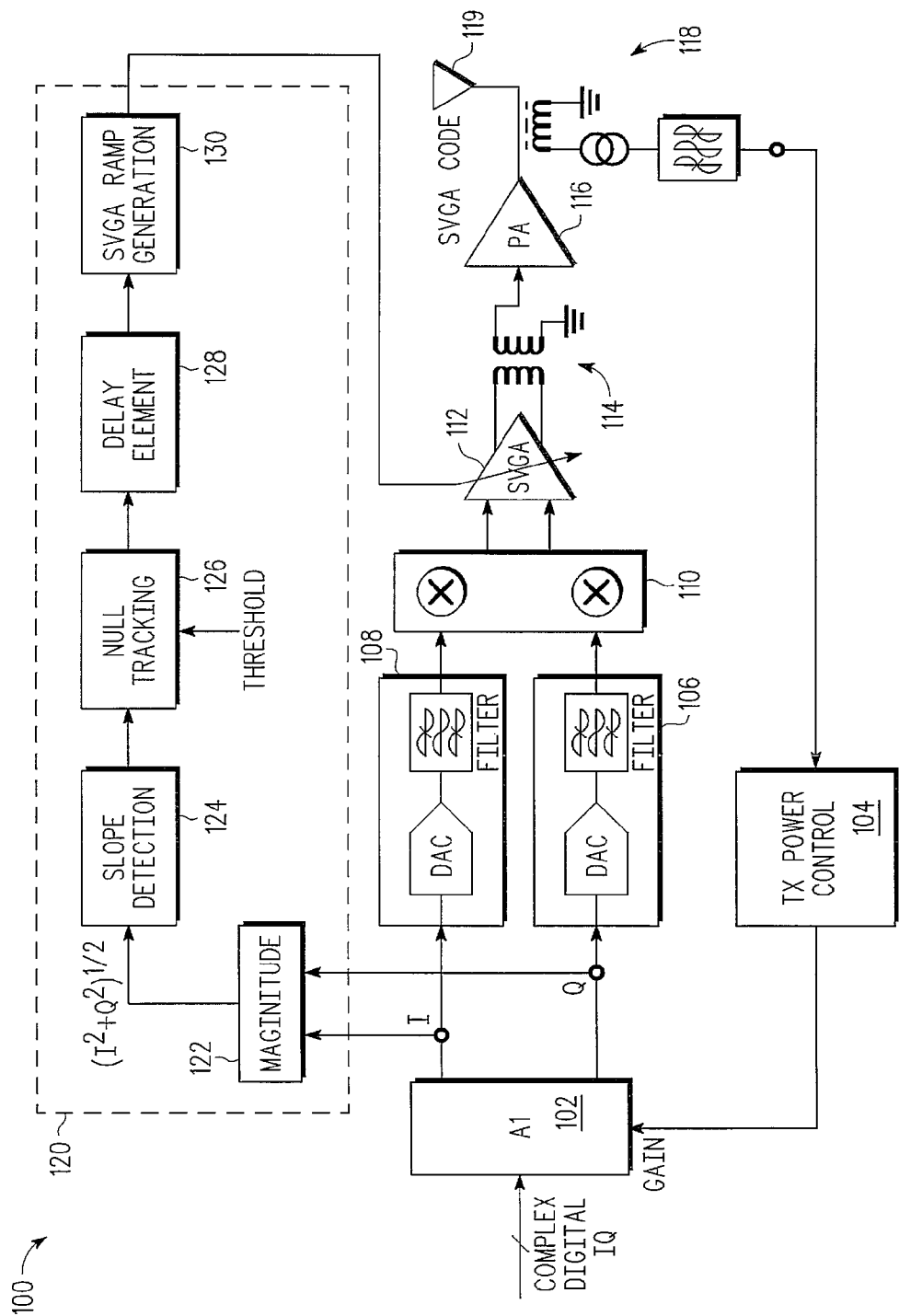
FIG. 1 is an example diagram of a relevant portion of a transmitter of a communication system that is configured to perform a variable gain amplifier (VGA) gain adjustment during a signal null according to various embodiments of the present disclosure.

In the following detailed description of exemplary embodiments of the invention, specific exemplary embodiments in which the invention may be practiced are described in sufficient detail to enable those of ordinary skill in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims and their equivalents. In particular, although various embodiments are described below in conjunction with a subscriber station, such as a cellular handset, it will be appreciated that the present invention is not so limited and may be embodied in various devices. As is used herein, the term "user equipment" is synonymous with the term "subscriber station," which is used to broadly denote a communication device associated with a wired or wireless communication system. As used herein, the term "coupled" includes a direct electrical connection between elements or blocks and an indirect electrical connection between elements or blocks achieved using one or more intervening elements or blocks.

Transmitters implemented within a wireless communication system, configured according to various embodiments of the present disclosure, may transmit information using a phase shift keying (PSK), a quadrature amplitude modulation (QAM), or other modulation scheme, depending upon which modulation scheme is scheduled. For example, any of the various PSK (such as pi/2 BPSK, QPSK, and 8-PSK), or QAM (such as 16-QAM and 64-QAM) modulation techniques may be implemented.

According to one embodiment of the present disclosure, a technique of operating a communication device includes identifying a signal null associated with a signal to be transmitted on a first communication channel (e.g., an allocated communication channel). A channel gain (e.g., a gain of a segmented variable gain amplifier (SVGA)) of the first communication channel is then adjusted in time to substantially coincide with the signal null to reduce transient noise spectrum coupled from the first communication channel to one or more second communication channels (e.g., adjacent and/or alternate communication channels). It should be appreciated that when an antenna operating power level is relatively low, transient noise specifications may be met without adjusting the channel gain during a signal null.

According to another aspect of the present disclosure, a communication device includes a variable gain amplifier (e.g., a segmented variable gain amplifier (SVGA)) and a signal null detector coupled to the variable gain amplifier. The signal null detector is configured to identify a signal null associated with a signal to be transmitted on a first communication channel. The signal null detector is also configured to provide a control signal to a control input of the variable gain amplifier to cause a channel gain of the first communication channel to be adjusted in substantial concurrence with the signal null to reduce transient noise spectrum coupled from the first communication channel to one or more second communication channels.

According to yet another aspect of the present disclosure, a wireless communication device includes a segmented variable gain amplifier and a signal null detector coupled to the segmented variable gain amplifier. The signal null detector is configured to identify a signal null associated with a signal to be transmitted on a first communication channel. The signal null detector is also configured to provide a control signal to a control input of the segmented variable gain amplifier to cause a channel gain of the first communication channel to be adjusted in substantial concurrence with the signal null to reduce transient noise spectrum coupled from the first communication channel to one or more second communication channels.

According to various aspects of the present disclosure, techniques are employed to effectively control RF glitches to improve transient noise spectrum (e.g., transient ACLR) and reduce RF splatter. According to the present disclosure, techniques are employed that search for signal nulls in a signal to be transmitted and step a gain of a segmented variable gain amplifier (SVGA) during a signal null. Adjusting a gain of an SVGA during a signal null (which has a relatively low instantaneous RF power level) generally minimizes adverse affects of transient ACLR. While the discussion herein is primary focused on transmitters that employ SVGAs, it is contemplated that the techniques described herein are broadly applicable to minimizing transient noise spectrum associated with transmitter gain adjustment. As mentioned above, techniques are employed that adaptively identify and track signal nulls and issue gain adjustments (e.g., gain cutbacks) in conjunction with signal nulls when gain adjustments are warranted (as opposed to arbitrarily performing gain adjustments, which may occur at a relatively high instantaneous RF power level). As gain adjustment is usually initiated at a lower instantaneous RF power level when the gain adjustment is timed to coincide with a signal null, transient ACLR is generally improved.

According to various aspects of the present disclosure, signal nulls associated with modulation and pulse shaping are identified to minimize transient ACLR impact during SVGA stepping. According to one aspect of the disclosure, envelope information (associated with a complex digital baseband signal) is utilized to predict potential signal nulls and slope detection is employed to accurately identify actual signal nulls. According to one or more aspects of the present disclosure, a programmable timer is employed to time SVGA stepping with a signal null. As signal nulls have lower instantaneous RF power (as compared to average power), identifying signal nulls and issuing SVGA gain steps to coincide with the signal nulls generally reduces transient ACLR. According to another aspect of the present disclosure, a programmable duration may be implemented between consecutive SVGA steps.

With reference to FIG. 1, a relevant portion of a transmitter 100 of a communication system is illustrated. As is shown, the transmitter 100 includes a digital gain block (A1) 102 that receives a complex digital signal that is to be transmitted. Digital in-phase (I)/quadrature phase (Q) samples are then converted to analog I and Q signals by a digital-to-analog converter (DAC), which is included in a DAC and bandpass (BP) filter block 108. Filtered DAC I and Q outputs are passed from the block 108 to inputs of an RF mixer 110 for up-conversion. I and Q outputs of the block 110 are provide to differential inputs of SVGA 112. Differential outputs of the SVGA 112 are coupled to primary inputs of a transformer 114. A first side of a secondary of the transformer 114 is coupled to a common point (e.g., ground) and a second side of the secondary of the transformer 114 is coupled to an input of a power amplifier (PA) 116. An output of the PA 116 is coupled to antenna 119. A detector and filter block 118 provide a feedback signal to an input of a transmit (Tx) power control block 104, which provides a control (gain) signal to a control input of the block 102 responsive thereto.

According to the present disclosure, a signal null detector 120 is implemented to detect signal nulls in a digital baseband signal magnitude (envelope) and coordinate gain adjustment of the SVGA 112 with a signal null. The detector 120 includes a magnitude block (function) 122 that receives digital I and Q signals at the I and Q outputs of the block 102. The magnitude block 122 is configured to calculate envelope information on the signal to be transmitted on an allocated communication channel. An output of the block 122 is coupled to an input of slope detection block (function) 124 that is configured to determine a slope of an envelope that corresponds to the envelope information. An output of the block 124 is coupled to an input of a null tracking block (function) 126. A threshold input of the block 126 receives a threshold signal that sets a threshold below which a signal null is indicated. That is, the null tracking block 126 is configured to predict the signal null when the envelope information is below a threshold level. An output of the block 126 is provide to an input of a programmable delay element 128, which delays a gain control signal provided by the block 126 an appropriate amount to align adjustment of the gain of the SVGA 112 with a signal null. An output of the delay element block 128 is coupled to an input of an SVGA ramp generation block 130, which provides an appropriate SVGA code to effect a desired gain change in conjunction with a signal null.

Figure 2:
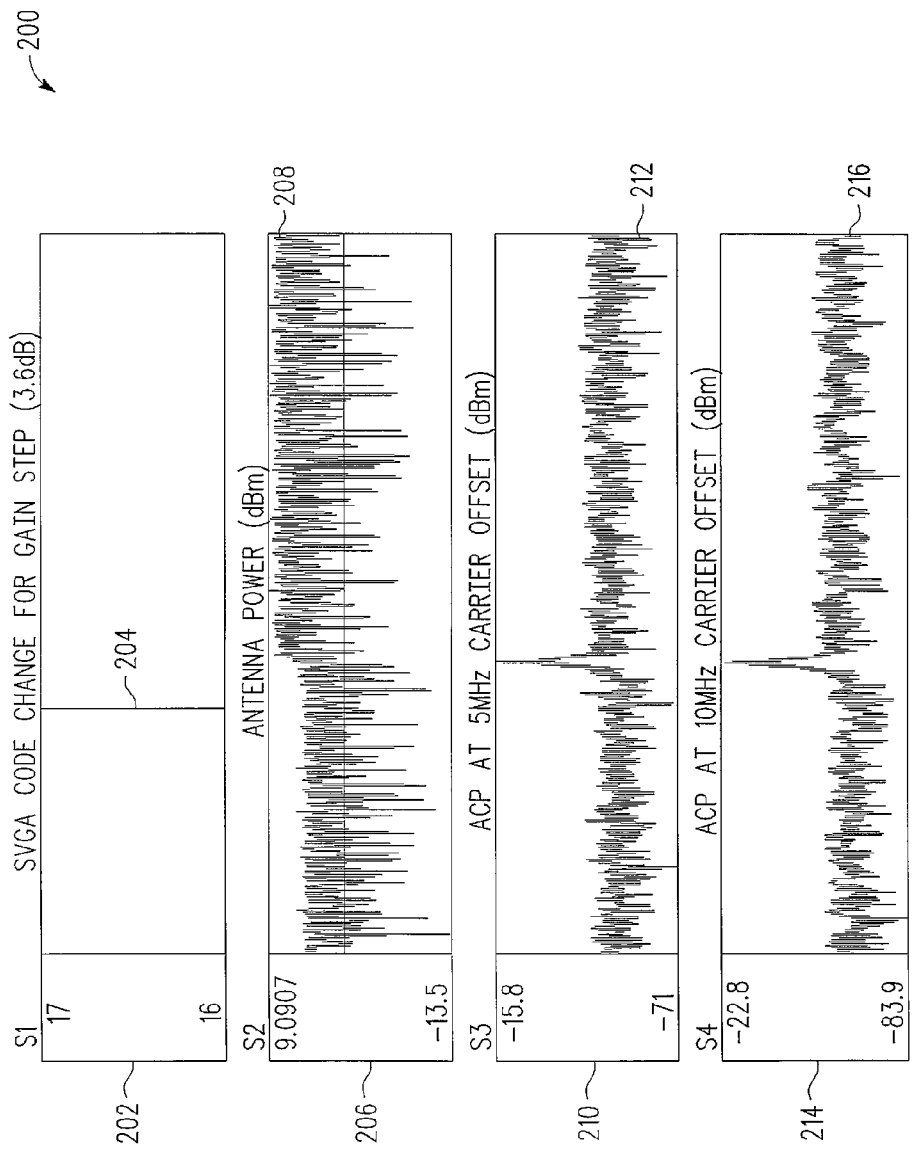
FIG. 2 is an example signal diagram that compares a number of waveforms associated with adjusting a gain of a segmented variable gain amplifier (SVGA) in a conventional transmitter of a conventional communication system.

Turning to FIG. 2, an example signal diagram 200 depicts a number of waveforms associated with an arbitrary gain adjustment of a segmented variable gain amplifier (SVGA) in a conventional communication system. With reference to block 202, an SVGA code change waveform 204 (for a 3.6 dB power change) is illustrated. An associated antenna power signal waveform 208 is illustrated in block 206. A transient ACLR waveform 212 for an adjacent channel (ACP @ 5 MHz carrier offset) is shown in block 210 and transient ACLR waveform 216 for an alternate channel (ACP @ 10 MHz carrier offset) is shown in block 214. As is illustrated, transient noise spectrum in the adjacent channel is approximately −15.8 dBm and transient noise spectrum in the alternate channel is approximately −22.8 dBm, which fails to meet a specification of −27 and −37 dBm, respectively, for a desired application.

Figure 3:
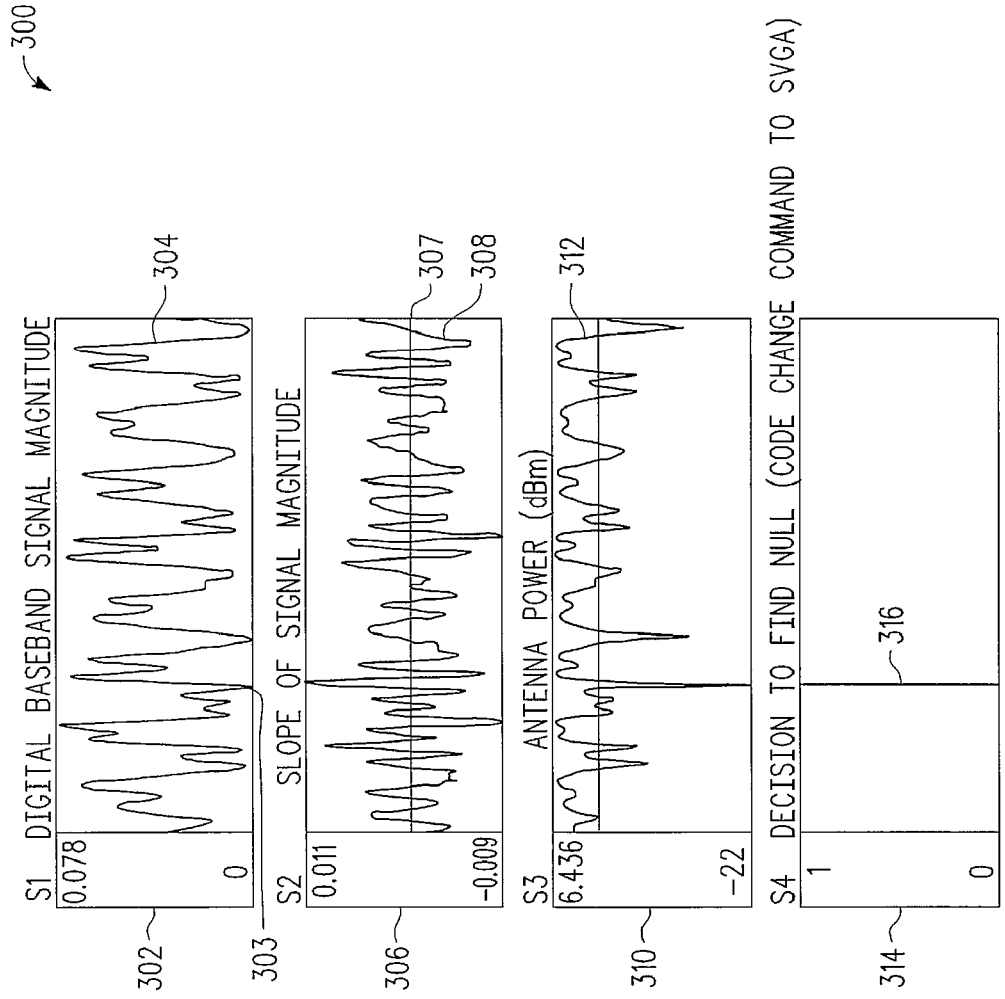
FIG. 3 is an example signal diagram that compares a number of waveforms associated with adjusting a gain of an SVGA (in a transmitter) in conjunction with a signal null, according to various embodiments of the present disclosure.

Moving to FIG. 3, an example signal diagram 300 shows a number of example waveforms associated with a gain adjustment of an SVGA in a communication system configured according to the present disclosure. With reference to block 302, an example digital baseband signal magnitude waveform (Sqrt($I^2+Q^2$)) 302 is illustrated. An example slope waveform 308 is depicted with an example threshold 307 in block 306. An associated example antenna power (in dBm) waveform 312 is illustrated in block 310. As is shown in block 314, an example code command change waveform 316 (to the SVGA) is coordinated to substantially coincide with a signal null. As noted above, coordinating a gain adjustment of an SVGA to substantially coincide with a signal null generally reduces transient ACLR in adjacent and alternate channels.

Figure 4:
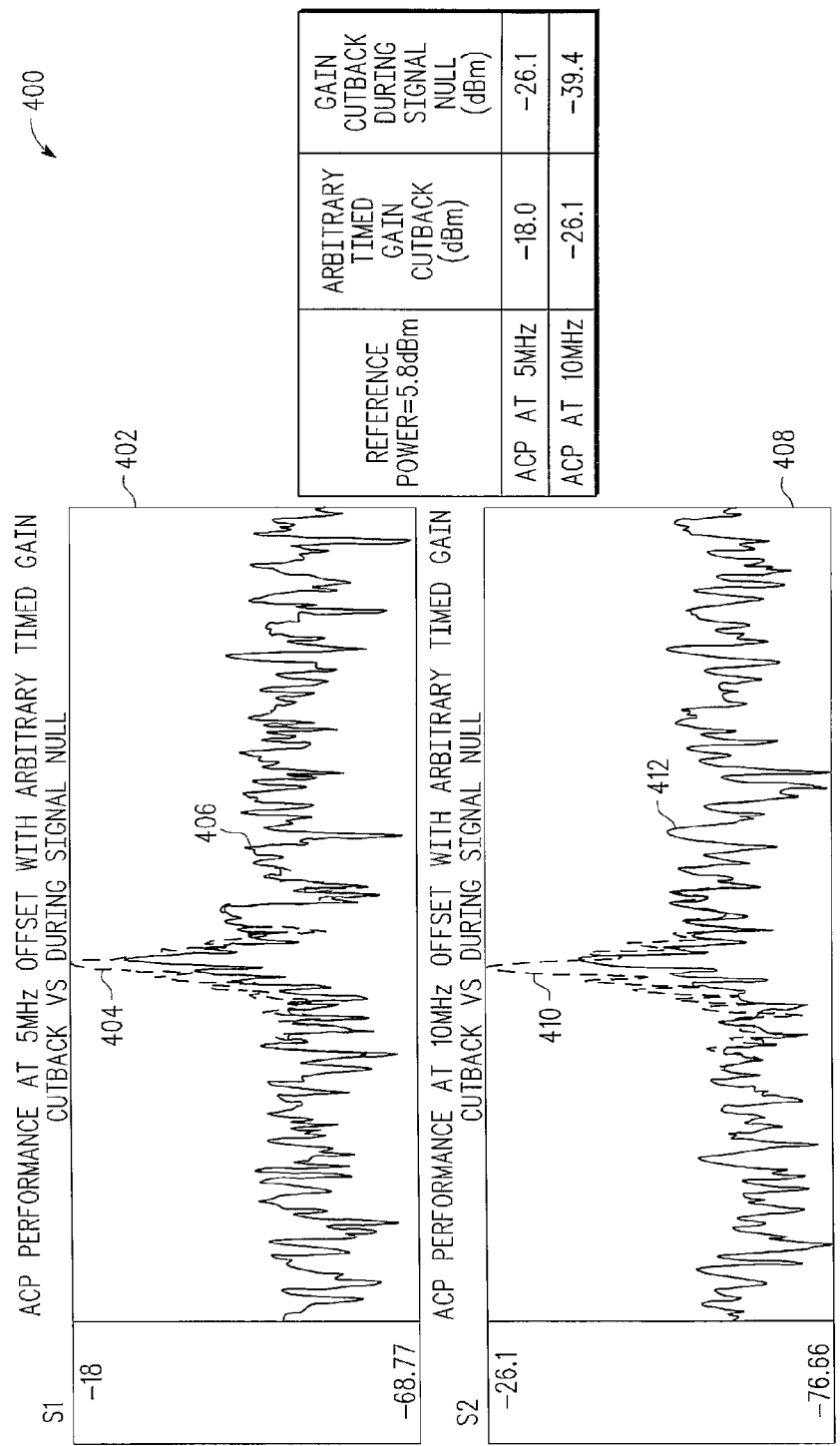
FIG. 4 is an example signal diagram that compares adjacent channel waveforms and alternate channel waveforms for conventional arbitrary timed gain adjustment and gain adjustment during signal nulls according to the present disclosure, respectively.

With reference to FIG. 4, block 402 depicts an example transient ACLR waveform 404 for an adjacent channel (ACP @ 5 MHz carrier offset) that is associated with an arbitrary timed gain adjustment and an example transient ACLR waveform 406 for an adjacent channel with a gain adjustment timed to coincide with a signal null. As is illustrated in block 408, an example transient ACLR waveform 410 for an alternate channel (ACP @ 10 MHz carrier offset) that is associated with an arbitrary timed gain adjustment is contrasted with an example transient ACLR waveform 412 for the adjacent channel with gain adjustment timed to coincide with a signal null. As is shown in block 402, transient noise spectrum in the adjacent channel is approximately −18.0 dBm for the arbitrary timed gain adjustment and −26.1 dBm for gain adjustment timed to coincide with a signal null. As is shown in block 408, transient noise spectrum in the alternate channel is approximately −26.1 dBm for the arbitrary timed gain adjustment and −39.4 dBm for gain adjustment timed to coincide with a signal null. In the simulation, adjusting the gain to substantially coincide with a signal null improved ACLR by approximately 8 dB in the adjacent channel (at 5 MHz) and approximately 13 dB in the alternate channel (10 MHz), as compared to the arbitrary timed gain adjustment approach.

Figure 5:
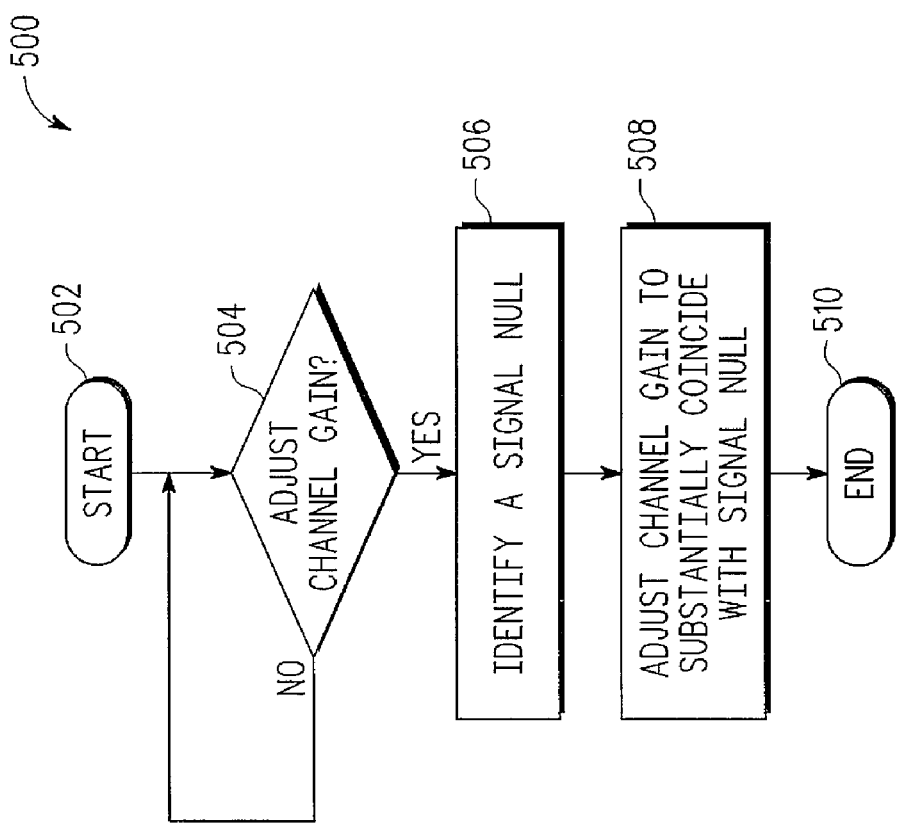
FIG. 5 is a flowchart of a process for initiating a gain adjustment of an SVGA during a signal null according to the present disclosure.

Turning to FIG. 5, a process 500 for reducing transient interference in adjacent and alternate channels in a communication system is shown. The process 500 may be, for example, implemented in code in a digital signal processor (DSP) of a subscriber station (SS). In block 502 the process 500 in initiated, at which point control transfers to decision block 504. In block 504, it is determined whether a command to adjust a gain (e.g., a gain of an SVGA) of an associated communication channel has been received. For example, a base station (BS) may command the SS to raise or lower a transmitted power level to substantially maintain a fixed received power level from the perspective of the BS. If a gain adjust command is not received in block 504, control loops on block 504. If a gain adjust command is received in block 504, control transfers to block 506, where a signal null is identified. As noted above, an envelope for a complex digital signal that is to be transmitted may be derived by calculating a magnitude of the complex digital signal over time. Slope detection may then be employed to determine whether the envelope is increasing or decreasing at a given point in time. When the envelope is decreasing below a threshold, a signal null is indicated. Then, in block 508 the channel gain is adjusted to substantially coincide with the signal null. As noted above, implementing a desired delay between commanding the SVGA to change gains may then be employed to align a detected signal null with a desired gain adjustment. Following block 508, the process 500 terminates in block 510 until a channel gain warrants adjustment again.

Figure 6:
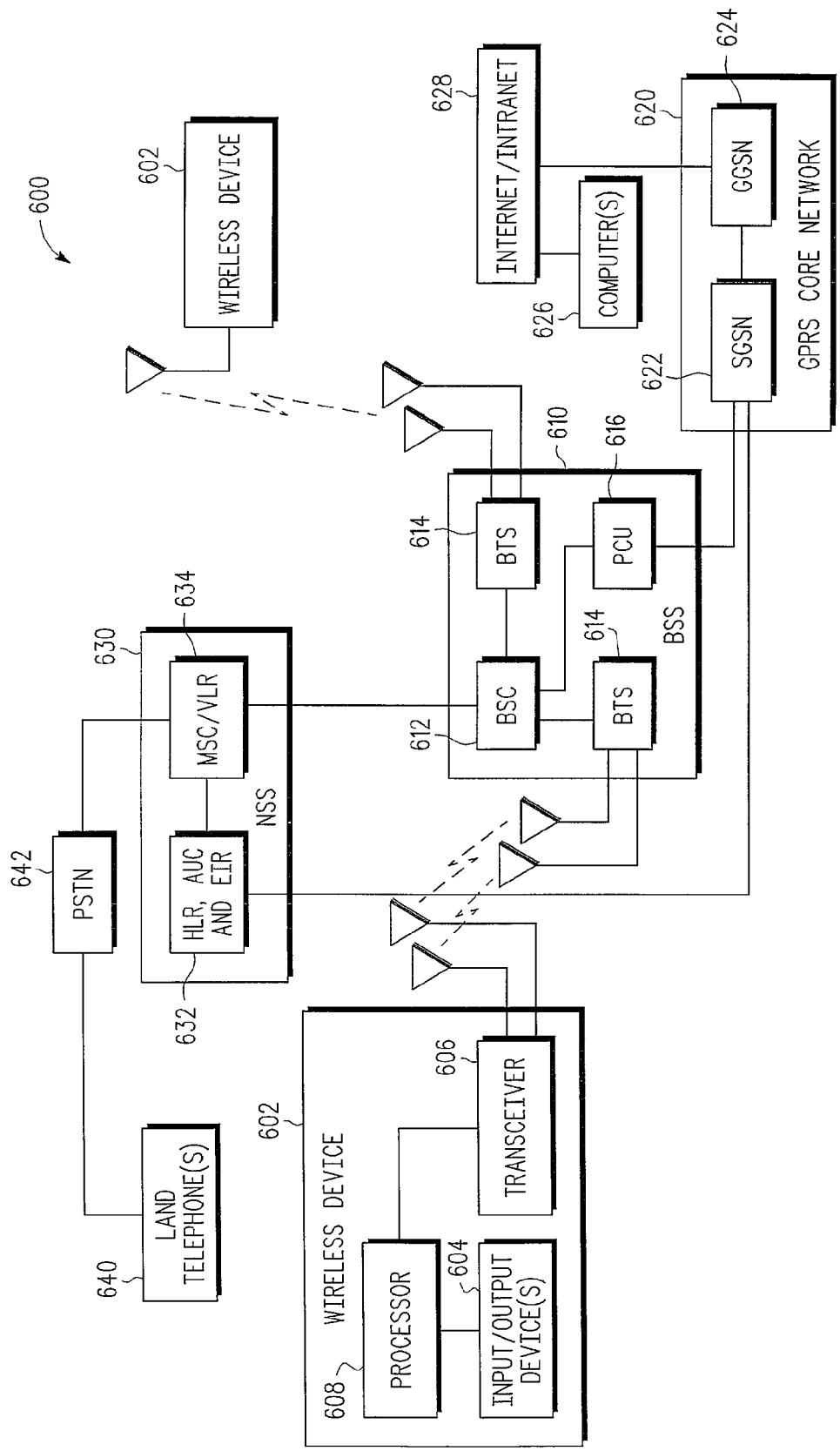
FIG. 6 is a block diagram of an example communication system that may initiate gain adjustment during signal nulls according to the present disclosure.

With reference to FIG. 6, an example communication system 600 is depicted that includes a plurality of wireless devices (subscriber stations) 602, e.g., handsets, that may be configured to initiate gain adjustment of a VGA (e.g., an SVGA) of a transmitter during a signal null in a digital baseband signal. In general, the wireless devices 602 include a processor 608 (e.g., a digital signal processor (DSP)) that employs a software system, a transceiver 606 (than includes the transmitter and a receiver), and one or more input/output devices 604 (e.g., a camera, a keypad, display, etc.), among other components not shown in FIG. 6.

As is noted above, according to various embodiments of the present disclosure, techniques are employed to reduce transient ACLR when a gain of an SVGA (included in the transmitter of the device 602) is adjusted responsive to receiving a power control message. The wireless devices 602 may communicate with a base station controller (BSC) 612 of a base station subsystem (BSS) 610, via one or more base transceiver stations (BTS) 614, to receive or transmit voice, data, or both voice and data. The BSC 612 may, for example, be configured to schedule communications for the wireless devices 602, as well as providing control signals (e.g., power control messages) to the wireless devices 602. Alternatively, the BTS 614 may schedule communications and power control messages for the wireless devices 602 in which the BTS 614 is in communication. In either case, a scheduler typically employs one or more processors (that execute a software system) to schedule communications.

The BSC 612 is also in communication with a packet control unit (PCU) 616, which is in communication with a serving general packet radio service (GPRS) support node (SGSN) 622. The SGSN 622 is in communication with a gateway GPRS support node (GGSN) 624, both of which are included within a GPRS core network 620. The GGSN 624 provides access to computer(s) 626 coupled to Internet/intranet 628. In this manner, the wireless devices 602 may receive data from and/or transmit data to computers coupled to the Internet/intranet 628. For example, when the devices 602 include a camera, images may be transferred to a computer 626 coupled to the Internet/intranet 628 or to another one of the devices 602. The BSC 612 is also in communication with a mobile switching center/visitor location register (MSC/VLR) 634, which is in communication with a home location register (HLR), an authentication center (AUC), and an equipment identity register (EIR) 632. In a typical implementation, the MSC/VLR 634 and the HLR, AUC, and EIR 632 are located within a network and switching subsystem (NSS) 630, which may also perform scheduling for the system 600. The SGSN 622 may communicate directly with the HLR, AUC and EIR 632. As is also shown, the MSC/VLR 634 is in communication with a public switched telephone network (PSTN) 642, which facilitates communication between wireless devices 602 and land telephones 640. It should be appreciated that other types of wired or wireless systems, having different configurations, may perform power control operations as is disclosed herein.

Accordingly, a number of techniques have been disclosed herein that generally reduce transient noise spectrum (e.g., transient ACLR) in a communication system. It is contemplated that the techniques described herein may be advantageously employed in wired or wireless communication systems that comply with a number of different standards.

As used herein, a software system can include one or more objects, agents, threads, subroutines, separate software applications, two or more lines of code or other suitable software structures operating in one or more separate software applications, on one or more different processors, or other suitable software architectures.

As will be appreciated, processes in preferred embodiments of the present invention may be implemented using any combination of software, firmware or hardware. For example, channel gain adjust code that implements the process 500 of FIG. 5 may be stored in the wireless devices 602 of FIG. 6. As a preparatory step to practicing the invention in software, the code (whether software or firmware) according to a preferred embodiment will typically be stored in one or more machine readable storage mediums such as fixed (hard) drives, diskettes, optical disks, magnetic tape, semiconductor memories such as read-only memories (ROMs), programmable ROMs (PROMs), etc., thereby making an article of manufacture in accordance with the invention. The article of manufacture containing the code is used by either executing the code directly from the storage device, by copying the code from the storage device into another storage device, such as a random access memory (RAM), etc., or by transmitting the code for remote execution. The method form of the invention may be practiced by combining one or more machine-readable storage devices containing the code according to the present disclosure with appropriate standard hardware to execute the code contained therein. An apparatus for practicing the techniques of the present disclosure could be one or more processors and storage systems containing or having network access to one or more programs coded in accordance with the present disclosure.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included with the scope of the present invention. Any benefits, advantages, or solution to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of operating a communication device, comprising:
   identifying, using a signal null detector of the communication device, a signal null associated with a signal to be transmitted on a first communication channel; and
   adjusting, using a variable gain amplifier of the communication device, a channel gain of the first communication channel to substantially coincide in time with the signal null to reduce transient noise spectrum coupled from the first communication channel to one or more second communication channels.

2. The method of claim 1, wherein one or more second communication channels include an adjacent channel and an alternate channel, and wherein the transient noise spectrum corresponds to adjacent/alternate channel leakage ratio and the channel gain is adjusted in response to a power adjust command from a base station.

3. The method of claim 1, wherein the adjusting further comprises:
   issuing a segmented variable gain amplifier step command to substantially coincide with the signal null.

4. The method of claim 1, wherein the signal null is attributable to, at least in part, modulation and pulse shaping.

5. The method of claim 1, wherein the identifying further comprises:
   determining envelope information on the signal to be transmitted on the first communication channel; and
   detecting, using a slope detector, a slope of an envelope that is based on the envelope information.

6. The method of claim 5, wherein the identifying further comprises:
   predicting the signal null when the envelope information is below a threshold level.

7. The method of claim 1, wherein the adjusting further comprises:
   stepping a gain of a segmented variable gain amplifier, at a time set by a programmable delay element, to substantially coincide with the signal null.

8. A communication device, comprising:
   a variable gain amplifier; and
   a signal null detector coupled to the variable gain amplifier, wherein the signal null detector is configured to:
      identify a signal null associated with a signal to be transmitted on a first communication channel; and
      provide a control signal to a control input of the variable gain amplifier to cause a channel gain of the first communication channel to be adjusted in substantial concurrence with the signal null.

9. The communication device of claim 8, wherein adjusting the channel gain of the first communication channel in substantial concurrence with the signal null reduces transient noise spectrum coupled from the first communication channel to adjacent and alternate channels, and wherein the transient noise spectrum corresponds to adjacent/alternate channel leakage ratio.

10. The communication device of claim 8, wherein the variable gain amplifier is a segmented variable gain amplifier that is implemented in a complementary metal-oxide semiconductor device.

11. The communication device of claim 8, wherein the signal null is attributable to, at least in part, modulation and pulse shaping of the signal.

12. The communication device of claim 8, wherein the signal null detector further comprises:
   a magnitude function configured to calculate envelope information on the signal to be transmitted on the first communication channel; and
   a slope detector coupled to the magnitude function, wherein the slope detector is configured to determine a slope of an envelope that is based on the envelope information.

13. The communication device of claim 12, wherein the signal null detector further comprises:
   a null tracking function coupled to the slope detector, wherein the null tracking function is configured to predict the signal null when the envelope information is below a threshold level.

14. The communication device of claim 13, wherein the signal null detector further comprises:
   a programmable delay element coupled to the null tracking function, wherein the programmable delay element is configured to time delay gain adjustment of the variable gain amplifier to substantially coincide with the signal null.

15. The communication device of claim 12, wherein the envelope information is based on a complex digital signal.

16. The communication device of claim 8, wherein the communication device is a wireless communication device.

17. A wireless communication device, comprising:
   a segmented variable gain amplifier; and
   a signal null detector coupled to the segmented variable gain amplifier, wherein the signal null detector is configured to:

identify a signal null associated with a signal to be transmitted on a first communication channel; and provide a control signal to a control input of the segmented variable gain amplifier to cause a channel gain of the first communication channel to be adjusted in substantial concurrence with the signal null to reduce transient noise spectrum coupled from the first communication channel to one or more second communication channels.

18. The wireless communication device of claim 17, wherein the signal null detector further comprises:

a magnitude function configured to calculate envelope information on the signal to be transmitted on the first communication channel; and a slope detector coupled to the magnitude function, wherein the slope detector is configured to determine a slope of an envelope that is based on the envelope information.

19. The wireless communication device of claim 18, wherein the signal null detector further comprises:

a null tracking function coupled to the slope detector, wherein the null tracking function is configured to predict the signal null when the envelope information is below a threshold level.

20. The wireless communication device of claim 19, wherein the signal null detector further comprises:

a programmable delay element coupled to the null tracking function, wherein the programmable delay element is configured to time delay gain adjustment of the segmented variable gain amplifier to substantially coincide with the signal null.

* * * * *